(12) United States Patent
Hatano et al.

(10) Patent No.: US 8,766,184 B2
(45) Date of Patent: Jul. 1, 2014

(54) SCANNING ELECTRON MICROSCOPE

(75) Inventors: Haruhiko Hatano, Hitachinaka (JP); Hiroyuki Suzuki, Mito (JP); Yoshihiko Nakayama, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/994,811

(22) PCT Filed: Nov. 2, 2011

(86) PCT No.: PCT/JP2011/006130
§ 371 (c)(1),
(2), (4) Date: Jun. 20, 2013

(87) PCT Pub. No.: WO2012/095911
PCT Pub. Date: Jul. 19, 2012

(65) Prior Publication Data
US 2013/0284923 A1   Oct. 31, 2013

(30) Foreign Application Priority Data
Jan. 14, 2011   (JP) .................................. 2011-005392

(51) Int. Cl.
*H01J 37/21*   (2006.01)
*H01J 37/20*   (2006.01)

(52) U.S. Cl.
CPC   *H01J 37/21* (2013.01); *H01J 37/20* (2013.01)
USPC ........... 250/310; 250/306; 250/307; 250/309; 250/311; 250/492.21

(58) Field of Classification Search
USPC .............. 250/306, 307, 309, 310, 311, 492.1, 250/492.2, 492.21, 492.22
See application file for complete search history.

(56) References Cited

U.S. PATENT DOCUMENTS

| 5,634,230 A | 6/1997 | Maurer |
| 7,304,302 B1 * | 12/2007 | Nunan et al. .................. 250/311 |
| 7,385,206 B2 * | 6/2008 | Motoi ....................... 250/492.21 |
| 7,705,329 B2 * | 4/2010 | Kaga ........................ 250/492.21 |

(Continued)

FOREIGN PATENT DOCUMENTS

| JP | 06-222081 A | 8/1994 |
| JP | 06-249611 A | 9/1994 |

(Continued)

*Primary Examiner* — David A Vanore
(74) *Attorney, Agent, or Firm* — Mattingly & Malur, PC

(57) ABSTRACT

With a scanning electron microscope (SEM) adopting a commonly available exhaust system such as a turbo-molecular pump, an ion pump, or a rotary pump, and so forth, there is realized an apparatus capable of safely executing observation, or adsorption of a target substance that is high in rarity. Further, there is realized a safe SEM low in the risk of an electrical discharge by providing the apparatus with a probe, a means for replacing an atmosphere in a specimen chamber, with a predetermined gas, and a means for forming an image by detection of an ion current, and detection of an absorption current. Further, there is provided a means for controlling the polarity of a voltage applied to the probe. Still further, there is provided a control means for controlling a value of the voltage applied to the probe according to a degree of vacuum.

10 Claims, 5 Drawing Sheets

(56) References Cited

U.S. PATENT DOCUMENTS

| | | | |
|---|---|---|---|
| 7,777,183 B2* | 8/2010 | Kaneoka et al. | 250/306 |
| 7,952,083 B2* | 5/2011 | Shichi et al. | 250/492.3 |
| 8,008,635 B2* | 8/2011 | Kagaya | 250/492.21 |
| 8,110,796 B2* | 2/2012 | Vertes et al. | 250/288 |
| 8,153,966 B2* | 4/2012 | Arai et al. | 250/306 |
| 8,426,835 B2* | 4/2013 | Kasuya et al. | 250/515.1 |
| 8,530,833 B2* | 9/2013 | Vertes et al. | 250/288 |
| 8,552,406 B2* | 10/2013 | Phaneuf et al. | 250/492.3 |
| 2008/0029699 A1* | 2/2008 | Kaneoka et al. | 250/307 |
| 2009/0121132 A1 | 5/2009 | Koops et al. | |
| 2009/0250610 A1 | 10/2009 | Nara et al. | |
| 2013/0284923 A1* | 10/2013 | Hatano et al. | 250/310 |
| 2013/0320229 A1* | 12/2013 | Miller et al. | 250/398 |

FOREIGN PATENT DOCUMENTS

| | | |
|---|---|---|
| JP | 08-254817 A | 10/1996 |
| JP | 09-229949 A | 9/1997 |
| JP | 10-134751 A | 5/1998 |
| JP | 10-282127 A | 10/1998 |
| JP | 2000-251820 A | 9/2000 |
| JP | 2003-242921 A | 8/2003 |
| JP | 2005-518638 A | 6/2005 |
| JP | 2005-311320 A | 11/2005 |
| JP | 2007-018935 A | 1/2007 |
| JP | 2007-179929 A | 7/2007 |
| JP | 2008-010151 A | 1/2008 |
| JP | 2008-151805 A | 7/2008 |
| JP | 2009-252854 A | 10/2009 |

* cited by examiner

SCANNING ELECTRON MICROSCOPE

TECHNICAL FIELD

The invention relates to a scanning electron microscope (SEM) suitable to observe, and extract a specimen in a particle-like shape, such as a powder, a particle, and so forth, and in particular, to a low vacuum SEM provided with a function for observation of an absorption current image, and a probe capable of causing the specimen in the particle-like shape to be adsorbed thereto.

BACKGROUND ART

There is available an apparatus capable of implementing various functions by use of a probe. The probe is used for various application objects; however, the probe is often used typically for an object of measuring the volt-ampere characteristic of a transistor formed on a semiconductor integrated circuit, or for an object of causing a foreign matter on a specimen under observation to be adsorbed to the probe for removal. The probe described as above is made up so as to be freely movable over a specimen or a specimen base by use of a predetermined driving mechanism, the driving mechanism for the probe, as a whole, being called a probing system.

For example, in Patent document 1, there is disclosed an inspection apparatus provided with a mechanism for removing a foreign matter on the surface of a wafer or a photo mask by use of the probing system in a semiconductor inspection step. With the invention described in Patent document 1, the foreign matter is caused to be adsorbed to the probe by the agency of an electrostatic force generated between the foreign matter and the probe, and thereafter, the probe with the foreign matter adsorbed thereto is moved outside the surface of the wafer to be thereby removed. Detection of a position of the foreign matter is made by use of a laser-scanning microscope. Thereby, foreign matters one by one can be reliably removed while inhibiting damage on the surface of the wafer.

Further, in Patent document 2, there is disclosed a foreign matter removal apparatus provided with an electron microscope, for removal of a foreign matter from a semiconductor wafer, and a stencil-mask, respectively. The foreign matter removal apparatus disclosed in Patent document 2 is provided with a canti-lever of an atomic force microscope (AFM), serving as a probe, whereupon a foreign matter is adsorbed to the probe by the agency of a shear force occurring by causing the canti-lever to be in contact with a foreign matter in a functional region (a region acting as a circuit) on a specimen, and the foreign matter is irradiated with a laser beam, or a converging ion beam outside the functional region after the foreign matter is removed to the outside of the functional region to thereby firmly fix, or remove the foreign matter. For detection of a position of the foreign matter, use is made of an SEM, or an optical microscope, and if the size of the foreign matter is on the order of nanometer, the SEM is used, while if the size of the foreign is on the order of micrometer, the optical microscope is used. Because the bond strength of the foreign matter, by the agency of the shear force, is greater than electrostatic adsorption, even a foreign matter that is firmly fixed onto the specimen can be removed with certainty.

CITATION LIST

Patent Literature

Patent Document 1: Japanese Unexamined Patent Application Publication No. Hei8(1996)-254817 (U.S. Pat. No. 5,634,230)

Patent Document 2: Japanese Unexamined Patent Application Publication No. 2005-311320

SUMMARY OF INVENTION

Technical Problem

The probing system is used for various objects such as a object of causing a target substance to be adsorbed as above, or a object of observing a target substance in such a state as adsorbed to a probe, and so forth; however, the necessity of having the step of detecting the position of the target substance by whatever method to thereby cause the target substance to be adsorbed to the probe is common to the various objects.

In the case of using the SEM for detection of the position of a target substance, it is necessary that a specimen under observation is disposed in a high vacuum, and therefore, the specimen need be disposed in a vacuum specimen chamber. A degree of vacuum inside the specimen chamber is dependent on a size of an observation specimen chamber, and performance of an exhaust system (a vacuum pump), and in the case of a common SEM, a degree of vacuum inside the observation specimen chamber is on the order of $10^{-4}$ Pa. In this connection, there is the case where adsorption of the target substance to the probe need be carried out by precluding occurrence of air pollution as much as possible owing to characteristic, or rarity of the target substance, and so forth. In order to remove a residual gas almost completely from the specimen chamber, it is necessary to raise the degree of vacuum inside the observation specimen chamber to a very high level. For example, the degree of vacuum of space is approximately on the order of $10^{-8}$ to $10^{-11}$ Pa, which is far above the degree of vacuum adopted in the observation specimen chamber for use in the common SEM A degree of vacuum attained in the specimen chamber is dependent on the performance of the exhaust system, and a volume of the specimen chamber. However, in order to introduce the probing system in the specimen chamber, the specimen chamber needs to have dimensions on the order of certain values in magnitude, and therefore, if the residual gas is to be almost completely removed from the specimen chamber, an extremely high-performance, and expensive exhaust means or exhaust system will be required.

In order to implement adsorption of the target substance to the probe by precluding air pollution with the use of an inexpensive exhaust system, it need only be sufficient to cause an atmosphere in the specimen chamber to be replaced with an inert gas, such as nitrogen gas, argon gas, and so forth. However, with the common SEM where secondary electrons are detected to thereby turn the secondary electrons into an image, there is the danger of occurrence of an electrical discharge because a high voltage is applied to the tip of a sintillator as a secondary electron detector. In the case where electrostatic adsorption is adopted as a method for adsorption of the target substance, a voltage is applied to the probe, so that the danger of the electrical discharge similarly exists.

It is therefore an object of the invention to realize an apparatus capable of safely executing observation, or adsorption of a target substance, in an electron microscope adopting a commonly available exhaust system such as a turbo-molecular pump, an ion pump, or a rotary pump, and so forth.

Solution to Problem

With the present invention, in order to solve the problem described as above, there is provided a means for replacing an atmosphere in a specimen chamber containing a target substance with a predetermined gas, and in order to acquire a specimen image in a low vacuum atmosphere, there is adopted an imaging system by detection of an ion current, and an absorption current. As a method for adsorbing the target substance, use may be made of either a method using an electrostatic adsorption, or a method using shearing stress. Thereby, observation of the target substance is enabled in an SEM adopting a commonly available exhaust system.

Further, in the case where the target substance is rare, or fragile, and so forth, an electrostatic adsorption method that is an adsorption method capable of soft adsorption is preferably used. With the present invention, it is possible to realize a scanning electron microscope capable of implementing safe adsorption of a target substance even in the case of adopting the electrostatic adsorption method.

Advantageous Effects of Invention

With the present invention, it is possible to provide an inexpensive scanning electron microscope capable of observing or adsorbing a target substance without causing the danger of electrical discharge.

DESCRIPTION OF EMBODIMENTS

Embodiments of a scanning electron microscope according to the invention are described hereinafter with reference to the accompanying drawings.

Figure 1:
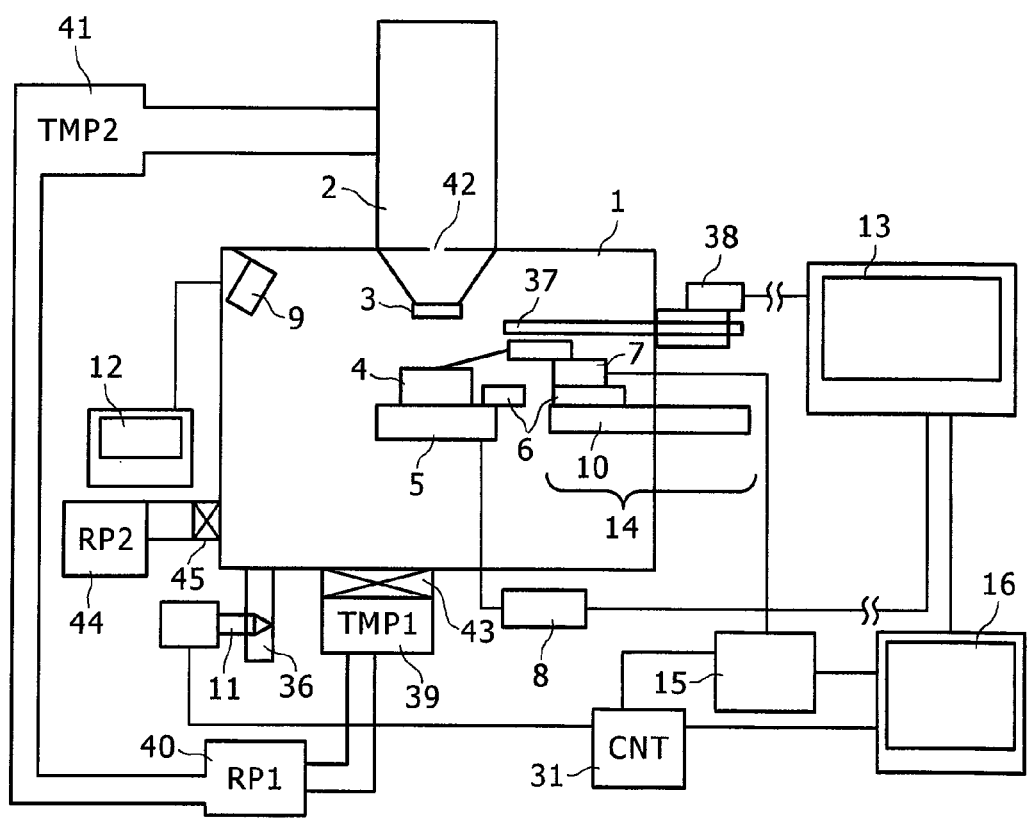
FIG. 1 is a block diagram of an electrostatic adsorption mechanism for a probe in a low vacuum scanning electron microscope.

FIG. 1 shows a general block diagram of a scanning electron microscope (an SEM) according to the present embodiment of the invention. The SEM according to the present embodiment is broadly comprised of a specimen chamber 1 for incorporating a specimen as a target substance for observation, or adsorption, an electron optical tube 2 disposed above the specimen chamber 1, for irradiating the specimen with a primary electron beam, a detection system for detecting an ion current amplified in a gas to be converted into an image signal, an exhaust system for evacuating the specimen chamber 1 into a vacuum, a supply system for supplying a replacement gas into the specimen chamber 1, a control system for controlling an operation of an apparatus, as a whole, and so forth.

A specimen holder 4 with a target substance placed thereon, a stage 5 for causing the specimen holder 4 to be moved, and a prober unit 7 for supporting a probe to be adsorbed to the target substance are provided inside the specimen chamber 1. A specimen placement surface of the specimen holder according to the present embodiment is made up of an electrically conductive material, the specimen holder having a function for detecting an ion current described later on. The prober unit 7 is provided on a prober base 10 in such a way as to be movable in a uniaxial direction over the prober base 10. A prober mechanism system 14 is made up of the prober unit 7, and the prober base 10. An interference-prevention mechanism 6 is provided on respective faces of the stage 5, and the prober base 10, opposing each other, detailed description thereof being given later on. The observation specimen chamber 1 is further provided with an infrared camera 9, the infrared camera 9 being linked with a monitor 12 for the infrared camera, via a cable. An image acquired by the infrared camera 9 is used to confirm a state of contact between the probe and the target substance.

The electron optical tube 2 is provided with a control means for irradiation with a primary electron beam, including an electron gun, a condenser lens, an objective lens, or a scanning deflector, the control means causing the primary electron beam to scan the target substance on the specimen holder 4 under a desired scanning condition. An ESED electrode 3 is provided at an end of the electron optical tube 2, adjacent to the target substance, the ESED electrode 3 being for use in generating an electric field for causing ions formed by collision of secondary electrons emitted upon the irradiation with the primary electron beam, against gas molecules in the surroundings, so as to be drifted toward the specimen stage. The ions drifted toward the specimen stage are collected by the specimen holder 4 to be detected as the ion current. Further, an orifice 42 is provided inside the electron optical tube 2, thereby realizing differential pumping between the electron optical tube 2 and the specimen chamber 1.

The detection system is made up of the specimen holder 4 provided with an ion current detection function, a first amplifier 8 for amplifying a detection current from the specimen holder 4, a movable type back-scattering electron (BSE) detector 37, a second amplifier 38 for amplifying a detection current from the movable type BSE detector 37, and so forth. An output signal of the first amplifier 8 or the second amplifier 38 is displayed on a monitor 13.

The exhaust system is made up of a first turbo-molecular pump 39 for evacuating the specimen chamber 1 into a vacuum, a second turbo-molecular pump 41 for evacuating the electron optical tube 2 into a vacuum, a first rotary pump 40 connected to the first turbo-molecular pump 39 and the second turbo-molecular pump 4, respectively to thereby function as a pump for backing up both the pumps, a second rotary pump 44 for roughly evacuating the specimen chamber 1, a first valve 43 for opening/closing an evacuation path between the first turbo-molecular pump 39, and the specimen chamber 1, a second valve 45 for opening/closing an evacuation path between the second rotary pump 44 and the specimen chamber 1, and so forth.

The supply system is provided with a gas-supply piping 36 for supplying the replacement gas into the specimen chamber 1. The gas-supply piping 36 is connected to a gas-supply source (not shown) of a desired replacement gas. Further, the gas-supply piping 36 is provided with a needle valve 11 for controlling a flow rate of a gas supplied to the specimen chamber 1, the needle valve 11 being controlled by a controller 31.

The control system is made up of a prober-unit power supply 15 for supplying a prober drive current to be supplied to the prober unit 7, the controller 31 for controlling the needle valve 11, and the prober-unit power supply 15, and an operation PC 16 for setting an operation condition of the apparatus, and so forth. The controller 31 is made up so as to incorporate a digital-to-analog converter (DAC) for converting respective digital control signals from a processor, and a memory, or a digital control signal from the processor, or a control PC into an analog signal for controlling the needle valve 11, and the prober-unit power supply 15, respectively. The operation PC 16 is provided with an input means (not shown) including a pointing device, such as a mouse, and so forth, a keyboard, and so forth, the operation PC 16 being capable of setting the operation condition of the apparatus via a GUI displayed on the monitor 13. The controller 31, the prober-unit power supply 15, the needle valve 11, and the operation PC 16 are connected to each other via a cable, respectively, and a signal is sent out from the operation PC 16 to the controller 31, whereupon the prober-unit power supply 15, and the needle valve 11 are controlled.

Figure 2:
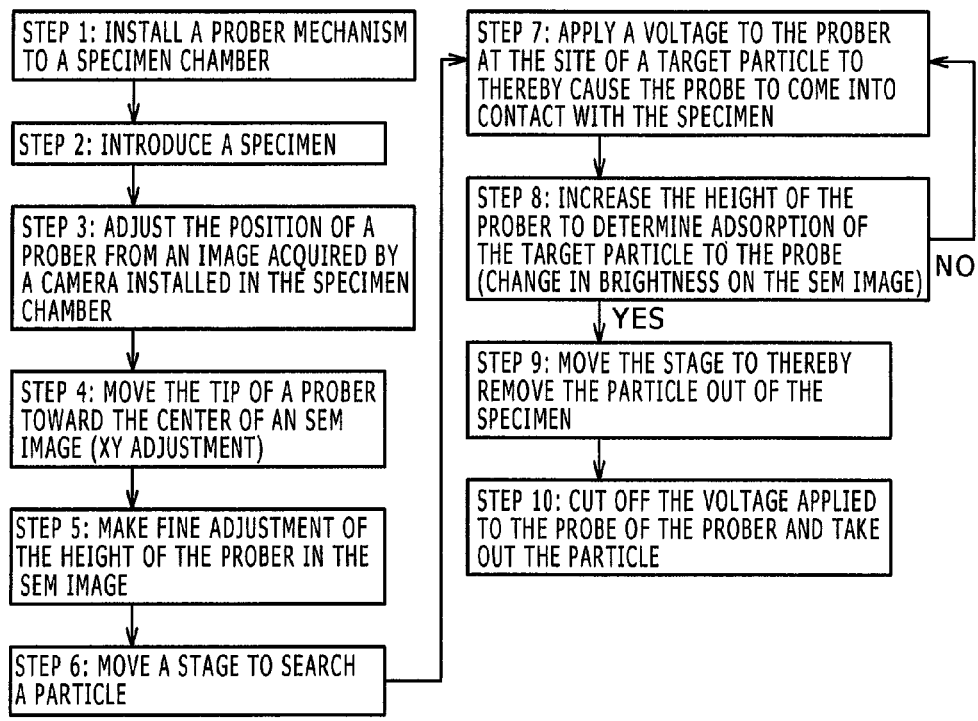
FIG. 2 is a flow chart showing a process for electrostatic adsorption of a particle to a probe.

FIG. 2 is a flow chart showing a series of operations up to the electrostatic adsorption of the target substance in the SEM according to the present embodiment. Further, in the following description, a particle placed on a suitable base material is described as the target substance by way of example; however, it goes without saying that the target substance is not limited thereto.

In Step 1, a prober mechanism is installed to the specimen chamber of a low vacuum SEM. Upon installation of the prober mechanism, a probe is installed to the prober unit 7 at first, and further, the prober unit 7 is installed to the prober base 10. Concurrently, the infrared camera 9 is installed to the specimen chamber 1. An installation position of the infrared camera 9 is a position in the specimen chamber 1 such that an irradiation position of the primary electron beam substantially corresponds to the center of a visual field of an infrared image. Thereby, an advance preparation is completed.

In Step 2, a specimen under observation is introduced into the specimen chamber, and vacuum drawing is executed inside the specimen chamber. When a degree of vacuum inside the specimen chamber is turned to on the order of $10^{-4}$ Pa according to measurement by a vacuum gage, observation is enabled, and at this point in time, the needle valve 11 is opened, whereupon a gas (for example, nitrogen gas) is introduced into the specimen chamber via the gas-supply piping 36. The needle valve 11 is under control by the controller 31, and fine adjustment is made such that a degree of vacuum inside the specimen chamber 1 (a value in a range of 100 to 1000 Pa) matches a set value. The set value of the degree of vacuum attained inside the specimen chamber 1 can be set by means of the GUI displayed on the monitor 13, and the operation PC 16. Upon attainment of the set degree of vacuum, the specimen holder 4 is introduced into the specimen chamber. The stage 5 is moved such that an initial position of the specimen holder 4 corresponds to a position where the center of the specimen holder is located immediately underneath the electron optical tube 2. In order to preclude air pollution, the specimen holder 4 is kept filled up with the gas while the top of the specimen holder 4 is covered with a special-purpose lid, and the lid is removed after the specimen holder 4 is introduced into the specimen chamber. If this method for introducing the specimen holder into the specimen chamber is adopted, it is possible to prevent contamination of the specimen holder 4 itself with an atmosphere before introduction into the specimen chamber.

In step 3, rough adjustment of a position of the probe installed to the prober unit 7 is executed in three XYZ axial-directions. This move is manually carried out; however, it is also possible to automate the move by use of a motor. Adjustment of the position of the probe, in the XY plane, is made by use of the operation PC 16 operated by a user of the apparatus such that the probe comes into the visual field of an image acquired by the infrared camera 9 while watching the image acquired by the infrared camera 9. The image acquired by the infrared camera 9 is displayed on the monitor 12 for the infrared camera.

Upon the specimen holder 4 approaching the prober unit 7, a height of the stage 5 is adjusted such that the probe of the prober unit 7 approaches a surface of the specimen holder 4 as much as possible. As fine adjustment of the height of the stage 5, in the Z-axis direction, is made on the basis of an SEM image displayed on the monitor 13, a height adjustment executed in the step 3 is a rough adjustment. The reason for this is to prevent the probe from being collided with the specimen holder 4 to be thereby damaged. In order to prevent the probe from interfering with the specimen holder 4 to be thereby damaged in this case, a travel distance of the prober unit 4, in the Z-axis direction, and a distance (height) of the surface of the specimen are calculated, and the controller 31 restricts a maximum travel distance of the prober mechanism travelling in the step 3 to a distance at which the probe does not come into contact with the specimen.

In step 4, there is executed adjustment of the position of the probe toward the center of the SEM image. This is because only rough registration is executed in the registration of the prober, by use of the infrared image, carried out in the step 3, and the respective tips of plural probes are not located at the center of a visual field on the SEM image. Since the prober is movable with accuracy of micrometers, no difficulty arises in implementing the registration of the probes toward the center. In this operation, the user of the apparatus makes use of a manual operation; however, an automatic operation by use of the controller 31 is also possible.

If it can be confirmed that the prober unit 7 and the specimen holder 4 approach each other within the image acquired by the infrared camera 9, the specimen is irradiated with an electron beam to thereby show an SEM image on the monitor 13. Because the specimen chamber 1 is in a low vacuum in this case, a common secondary electron detector where a high voltage is applied is unusable owing to the danger of electrical discharge. Accordingly, an ion current image from which an image like a secondary electron image is obtainable is picked up to be shown as an image on the monitor 13. The ion current attributable to the secondary electrons is detected by the specimen holder 4 to be amplified by the amplifier 8 before being displayed on the monitor 13.

Figure 3:
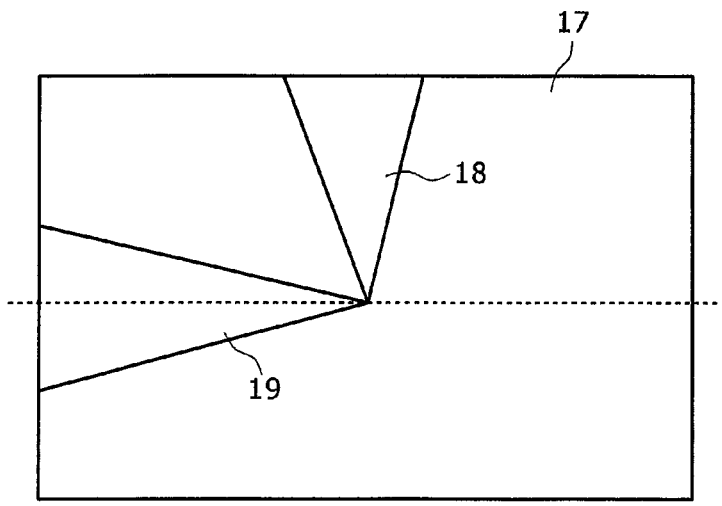
FIG. 3 is a schematic representation showing a layout of two lengths of probe tips on an SEM screen.
Figure 8:
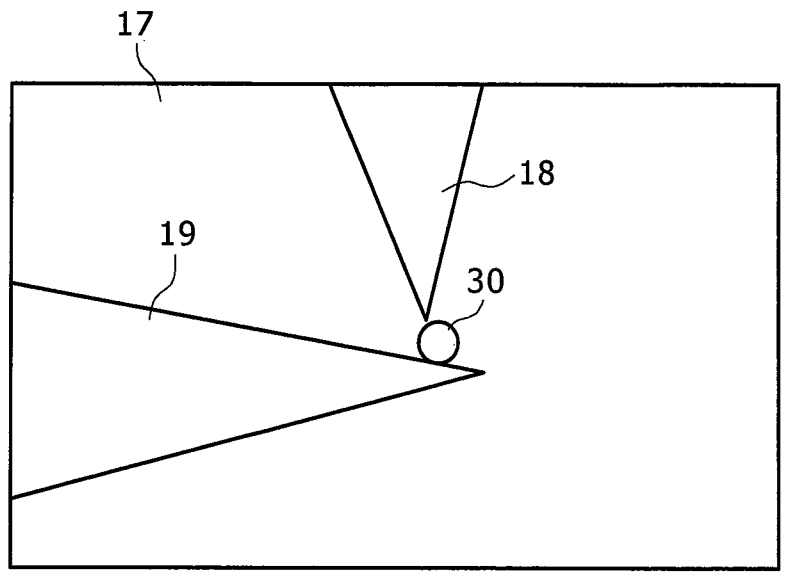
FIG. 8 is a schematic representation of the SEM screen, showing an operation whereby if a particle is adsorbed to a site of a probe 19, other than the tip thereof, the particle is moved by use of another probe.

In FIG. 3, there is shown an example of an SEM image in a state where two lengths of probes have come into a visual field. In an operation for adsorption of a particle, plural probes are preferably used, making use of at least two lengths of the probes. For example, if a particle 30 is adsorbed to a site in a probe 19, deviate from the tip thereof, as shown in FIG. 8, this will interfere with smooth transportation of the particle 30. If there are available plural lengths of probes (for example, two lengths thereof), the particle 30 can be moved by use of the other probe 18. Accordingly, the number of probes is preferably plural.

The prober mechanism system 14 is connected to a special-purpose power supply (the prober-unit power supply 15) by a cable, and the prober mechanism system 14 can be operated by use of the operation PC 16. An operator moves the prober unit 7 such that the probe comes to the center of a visual field on the SEM image, as shown in FIG. 3. In the case of the two lengths of the probes, shown in FIG. 3, adjustment is made in such a way as to prevent the tip 18 of the probe from interfering with the tip 19 of the other probe on an SEM screen 17.

In step 5, there is executed fine adjustment of the height of the probe. This operation being for the purpose of the fine adjustment, the user of the apparatus executes the operation through a manual operation. In the step 5, the probe is kept floated so as to be focused within a working distance (WD) in the SEM image while preventing the probe from coming into contact with the specimen.

In step 6, the stage is moved to search a target particle. The probe is always kept at the center of an image by moving the stage instead a side adjacent to the prober unit 7, so that adsorption can be always implemented at the center position in the visual field of the SEM image (that is, the center position of an optical axis).

In this connection, an interference between the prober unit 7 and the specimen holder 4 (or the stage 5), occurring at the time when the stage 5 is moved, that is, a collision therebetween will raise a problem. In order to avoid the problem, a maximum travel distance of the stage 5 is normally restricted to a scope within which the interference is prevented from occurring between the stage 5 and the prober unit 7. In the case where a particle is at a position beyond the maximum travel distance, it becomes difficult to find the particle. Accordingly, the interference-prevention mechanism 6 (shown in FIG. 1) is installed to the stage 5, and the prober unit 7, respectively.

Figure 4:
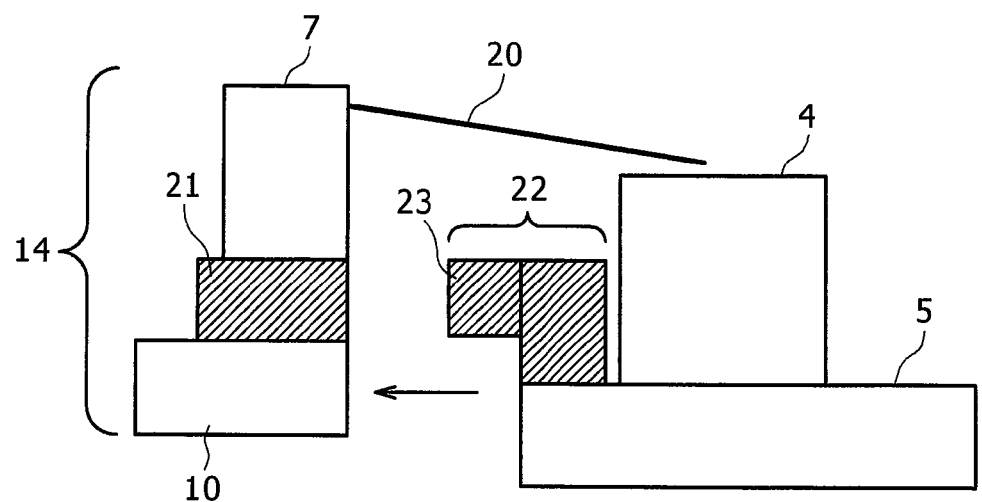
FIG. 4 is a block diagram showing members of an interference-prevention mechanism, installed on a stage, and a prober mechanism, respectively.
Figure 5:
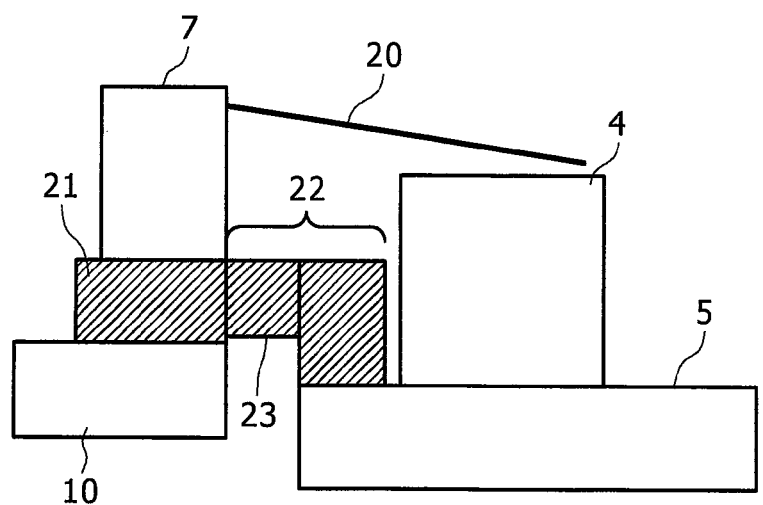
FIG. 5 is a schematic representation showing the interference-prevention mechanism of FIG. 4, in as-activated state.

FIGS. 4, 5 each show details, and an operation with respect to the interference-prevention mechanism 6. The interference-prevention mechanism 6 is made up of two components, that is, a prober-unit side interference-prevention member 21 disposed on the prober base 10, and a stage side interference-prevention member 22 disposed on the stage 5. The prober-unit side interference-prevention member 21 is movable on the prober base 10, and the prober unit 7 is disposed on the prober-unit side interference-prevention member 21. Now, when the stage 5 is moved in the direction of an arrow shown in FIG. 4 (leftward in the direction parallel to the plane of the figure), a leading-end member 23 of the stage side interference-prevention member 22 protrudes from the outer side of the stage 5, so that the leading-end member 23 interferes with the prober mechanism system 14 before the stage 5 interferes with the prober mechanism system 14. At this point in time, the leading-end member 23 interferes with the prober-unit side interference-prevention member 21, whereupon the prober-unit side interference-prevention member 21 is pushed by the leading-end member 23 to be moved backward of the prober base 10 (leftward in the direction parallel to the plane of the figure).

FIG. 5 shows a state of the prober-unit side interference-prevention member 21 that is pushed by the leading-end member 23 to be thereby moved backward of the prober base 10. The prober unit 7 fixedly installed to the prober-unit side interference-prevention member 21, as well, is concurrently moved due to the movement of the prober-unit side interference-prevention member 21, so that the interference between the stage 5 and the prober unit 7 can be avoided.

Figure 6:
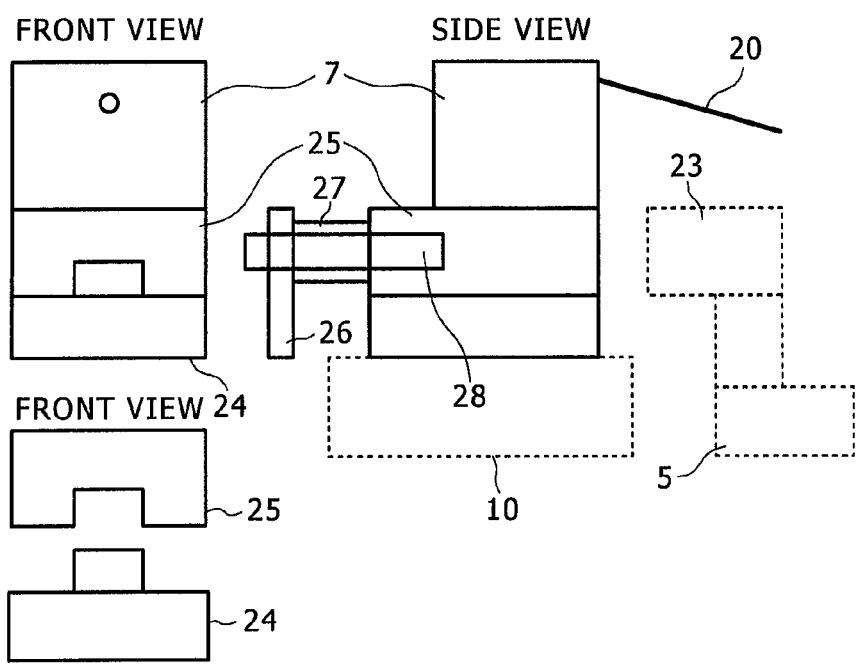
FIG. 6 is a functional diagram showing the interference-prevention mechanism in detail.

FIG. 6 shows details of the prober-unit side interference-prevention member 21. There is provided a base (a slide-base lower-side member 24) serving as a rail for causing the prober-unit side interference-prevention member 21 to slide in such a way as to be movable on the prober base 10, and a slide-base upper-side member 25 is provided on the top of the slide-base lower-side member 24. The slide-base upper-side member 25 has a groove formed along the shape of the rail, and the groove is fitted over the rail to thereby combine the slide-base lower-side member 24 with the slide-base upper-side member 25.

Further, the slide-base upper-side member 25 is provided with a post 28 around which a spring 27 is wound, and a support bar 26 for fixing the post 28 against the slide-base upper-side member 25, as shown in a right-side figure of FIG. 6. Upon the leading-end member 23 colliding with the slide-base upper-side member 25, the slide-base upper-side member 25 is moved backward on the rail serving as a guide of the slide-base lower-side member 24. When the stage 5 stops, the leading-end member 23 as well stops, whereupon the slide-base upper-side member 25 is fixedly held owing to a balance kept between a pushing force of the leading-end member 23 and a restoring force of the spring 27. For the spring 27, selection is made of a spring having an appropriate spring constant such that the restoring force will be substantially equivalent in magnitude to the pushing force of the leading-end member 23.

Next, when the stage 5 is moved in the reverse direction, the leading-end member 23 is moved away from the slide-base upper-side member 25, whereupon the slide-base upper-side member 25 is moved on the rail in the reverse direction, thereby returning to the original position by the agency of the restoring force of the spring 27. A maximum distance at which interference is preventable is dependent on the length of the leading-end member 23, and a distance between the slide-base upper-side member 25 and the support bar 26. The maximum distance is decided such that the travel distance of the stage 5 can cover the whole region on the specimen holder 4. With the adoption of a mechanism described as above, the travel distance of the stage 5 can cover the whole region of the specimen holder 4 without causing the interference between the stage 5 and the prober unit 7.

Upon finding of a target particle as a result of movements of the stage, a voltage is applied to the probe to thereby cause the probe to come into contact with a target substance (step 7). In this case, the target particle is moved toward the center of the SEM image, and subsequently, the voltage is applied to the probe to thereby cause the probe to move to the vicinity of the particle. The stage 5, instead of the probe, may be moved in the Z-axis direction to thereby cause the probe to come into contact with the target substance. In this connection, in the case of moving the probe, the SEM image is brought into focus on a side of the mechanism, adjacent to the target particle, whereas the SEM image is brought into focus on a side of the mechanism, adjacent to the probe, in the case of moving the stage, thereby causing respective movements to be made such that the SEM images on the respective sides to fall within a focal length.

Now, there is described hereinafter control of the polarity of the voltage applied to the probe at the time of causing the target particle to be electrostatically adsorbed. In the case of adsorbing a target substance by use of an electrostatic force, if the voltage applied to the probe is identical in polarity to an electric charge of the target substance, a repulsion force instead of an adsorption force will occur, and therefore, adsorption will not take place. Accordingly, it is necessary to control the polarity of the voltage applied to the probe in contradistinction from a charged state of the target substance. For this reason, with the present embodiment, the prober-unit power supply 15 is provided with a polarity-changeover switch, thereby rendering it possible to change the polarity of the voltage applied to the probe in contradistinction from the charged state of a particle 30.

Figure 7:
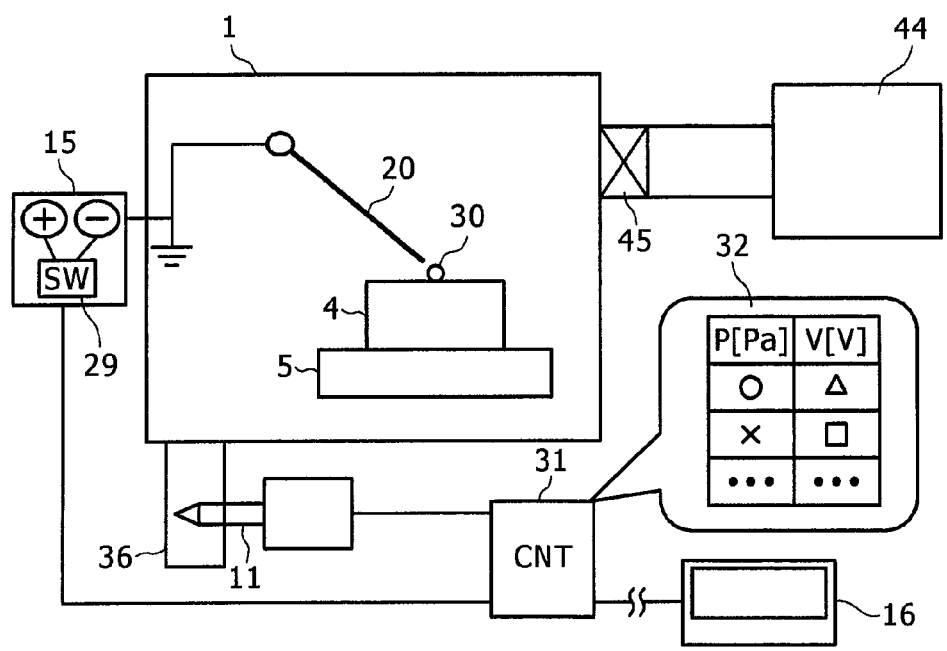
FIG. 7 is a block diagram of a control mechanism for automatically controlling a voltage applied to the probe tips, and a degree of vacuum.

FIG. 7 shows details of control of the voltage applied to the tip of the probe. A value of a voltage applied from the prober-unit power supply 15 to a probe 20 is controlled by the controller 31. Meanwhile, the prober-unit power supply 15 is provided with a changeover switch 29, so that the voltage applied to the probe 20 can be changed over in polarity between plus/minus according to a control signal from the controller 31. Because changeover in polarity between plus/minus is implemented by manual operation undertaken by the user of the apparatus, an operation screen where the polarity of the voltage applied to the probe 20 is set or changed is displayed on the GUI shown on the monitor 13 in the case of the SEM according to the present embodiment. This display operation is implemented by means of the operation PC 1.

The specimen chamber 1 is filled up with a gas in order to avoid contamination of the particle with air. Accordingly, if an excessively high voltage is applied to the probe 20, the danger of an electrical discharge will occur. With the SEM according to the present embodiment, there is therefore pre-measured a value of the applied voltage at which the electrical discharge does not occur against an assumed degree of vacuum, as an operation condition of the SEM, and respective values of voltages applied to the probe, corresponding to the respective degrees of vacuum are tabulated to be stored in a memory of the controller 31. The controller 31 controls a value of each voltage applied to the probe 20 in accordance with a table 32 shown in FIG. 7. Furthermore, the controller 31 controls the needle valve 11 to thereby control the flow rate of the gas in the gas-supply piping 36. For example, in the case where a pressure of the gas-supply source undergoes an abrupt variation, and so forth, the controller 31 takes a reading of the flow meter associated with the needle valve 11 to thereby control a degree of opening/closing of the needle valve 11 so as to preclude occurrence of the electrical discharge at a value of a voltage presently being applied to the probe. Otherwise, the controller 31 compares a set degree of vacuum in the chamber 1 with the table 32, thereby causing a voltage applied to the probe 20 to be automatically adjusted to a voltage value at which the electrical discharge does not occur. Thus, if the controller 31 controls the needle valve 11 in association with the voltage applied to the probe 20, this will enable safe adsorption of the target substance without the risk of the occurrence of the electrical discharge.

In step 8, there is executed determination on adsorption. Upon the adsorption of a target particle to the probe, there occurs a change in brightness of the SEM image, and therefore, the determination on the adsorption is executed by visual check of the change in brightness. Unless the change in brightness can be confirmed, an operation reverts to the step 7 to thereby repeat an operation in the step 8 again.

If the adsorption of the target particle to the probe is confirmed, the probe with the target particle adsorbed thereto is moved to a predetermined position by moving the stage (step 9). When the probe is moved, there arises a possibility that the particle is dislodged due to vibration, and so forth, and therefore, the stage is moved with the voltage applied to the probe, in as-applied state.

Upon the probe being moved to the predetermined position, the voltage applied to the probe is cut off, and the particle is dislodged from the probe (step 10).

Figure 9:
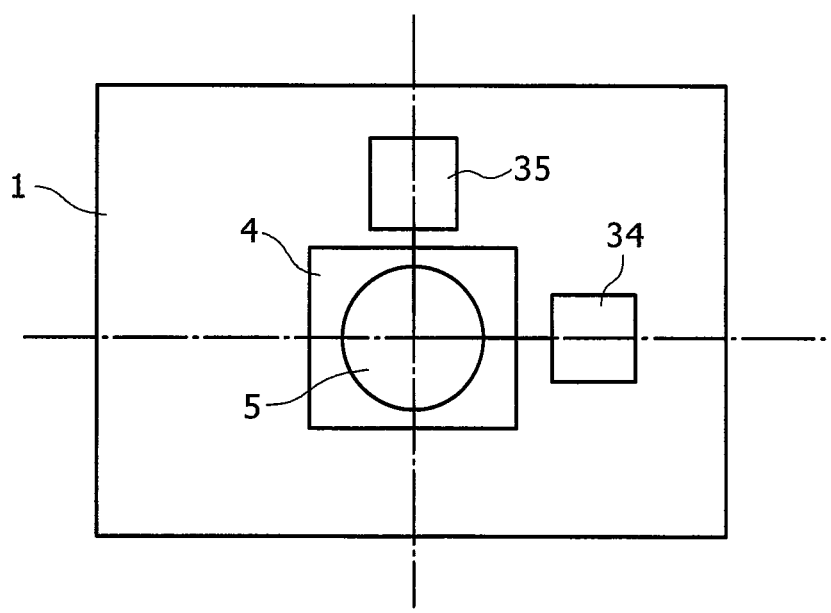
FIG. 9 is a layout top view of a specimen chamber in the case where two lengths of probers are provided.

FIG. 9 shows a layout of the prober unit 7, in detail. FIG. 9 is a top view of the specimen chamber 1 as seen from the electron optical tube 2. Prober units 34, 35 are disposed in such a way as to be orthogonal to each other against the electron optical tube 2, being adjusted such that the respective probes of the probers are aligned with the center line of the electron optical tube 2. This operation is carried out in the steps 4, 5, described in FIG. 2, respectively. If the electrostatic adsorption of the particle 30 to the probe 20 can be confirmed on the SEM screen 17, the stage 5 is moved to thereby transport the particle 30 to a predetermined position. After the stage 5 is moved to a predetermined position, the prober unit 7 is moved to the vicinity of the specimen holder 4, whereupon the voltage applied to the probe is cut off by use of the operation PC 16. Upon confirmation that the particle 30 is placed at the predetermined position, the probe 20 is removed away from the specimen holder 4, whereupon the operation is completed. As a result of processing described as above, it becomes possible to cause the particle to be adsorbed to the probe by the agency of the electrostatic adsorption in the low vacuum SEM before being transported.

LIST OF REFERENCE SIGNS 1 specimen chamber
2 electron optical tube
3 gas amplification detector (ESED electrode)
4 specimen holder
5 stage
6 interference-prevention mechanism
7 prober unit
8 first amplifier
9 infrared camera
10 prober base
11 needle valve
12 monitor for the infrared camera
13 monitor
14 prober mechanism system
15 prober-unit power supply
16 operation PC
17 SEM screen
18 tip of a probe 1
19 tip of a probe 2
20 probe
21 prober-unit side interference-prevention member
22 stage side interference-prevention member
23 leading-end member
24 slide-base lower-side member
25 slide-base upper-side member
26 support bar
27 spring
28 post
29 changeover switch
30 particle
31 controller
32 vacuum degree—voltage value table
33 prober unit 1
34 prober unit 2
35 gas-supply piping
38 second amplifier

The invention claimed is:

1. A scanning electron microscope provided with a specimen chamber for storing a target substance, and a vacuum pump for evacuating the specimen chamber into a vacuum, the scanning electron microscope comprising:
a gas introduction pipe for introducing a gas into the specimen chamber evacuated into a vacuum by use of the vacuum pump;
a electron optical tube for detecting an ion current, the ion current being generated by amplifying a secondary electron, or a reflection electron, emitted from the target substance, upon irradiation of the target substance in the specimen chamber with a primary electron beam, in the gas;

a probe for adsorbing the target substance;

a probe-movable mechanism for causing the probe to be moved inside the specimen chamber; and a power supply unit for applying a voltage for generating an electrostatic adsorption force to the probe;

wherein the power supply unit applies the voltage for electrostatically adsorbing the target without an electrical discharge against a degree of vacuum in the specimen chamber.

2. The scanning electron microscope according to claim 1, wherein the gas introduction pipe comprises a valve for adjusting a flow rate of the gas flowing inside the gas introduction pipe.

3. The scanning electron microscope according to claim 1, further comprising:

a valve for adjusting a flow rate of the gas flowing inside the gas introduction pipe; and a control means for automatically adjusting a voltage from the power supply unit to be applied to the probe, and the valve.

4. The scanning electron microscope according to claim 3, wherein the control means is provided with a table listing respective degrees of vacuum in the specimen chamber, and respective values of voltages applied to the probe, at the respective degrees of vacuum.

5. The scanning electron microscope according to claim 4, wherein the control means is connected to an operation PC to thereby enable automatic control by operating GUI from the operation PC.

6. The scanning electron microscope according to claim 1, wherein the power supply unit is capable of changing over the polarity of the voltage applied to the probe.

7. The scanning electron microscope according to claim 1, wherein a plurality of the probes can be installed to the probe-movable mechanism.

8. The scanning electron microscope according to claim 1, further comprising:

a specimen holder with a target substance placed thereon; and a stage for causing the specimen holder to be moved, wherein the probe-movable mechanism and the stage are each provided with an interference-prevention mechanism for preventing an interference between the probe-movable mechanism and the stage.

9. The scanning electron microscope according to claim 8, wherein the interference-prevention mechanism installed on a side adjacent to the probe-movable mechanism is a member installed on the probe-movable mechanism so as to be movable thereon.

10. The scanning electron microscope according to claim 9, wherein the interference-prevention mechanism installed on a side adjacent to the probe-movable mechanism is provided with a spring, and a support member for fixing the spring against the interference-prevention mechanism.

* * * * *